United States Patent [19]

Tsutsui

[11] Patent Number: 4,720,732
[45] Date of Patent: Jan. 19, 1988

[54] PATTERN TRANSFER APPARATUS

[75] Inventor: Shinji Tsutsui, Yokohama, Japan

[73] Assignee: Canon Kabushiki Kaisha, Tokyo, Japan

[21] Appl. No.: 942,954

[22] Filed: Dec. 17, 1986

Related U.S. Application Data

[63] Continuation of Ser. No. 689,944, Jan. 9, 1985, abandoned.

[30] Foreign Application Priority Data

Jan. 30, 1984 [JP] Japan .................. 59-13317

[51] Int. Cl.$^4$ .................. G03B 27/52
[52] U.S. Cl. .................. 355/30; 355/53
[58] Field of Search .................. 355/30, 53

[56] References Cited

U.S. PATENT DOCUMENTS

| | | |
|---|---|---|
| 3,865,254 | 2/1975 | Johannsmeier . |
| 4,202,623 | 3/1980 | Watkin . |
| 4,256,829 | 3/1981 | Daniel . |
| 4,432,635 | 2/1984 | Mayer .................. 355/30 |
| 4,503,335 | 5/1985 | Takahashi .................. 355/30 |

FOREIGN PATENT DOCUMENTS 56-112732 9/1981 Japan .
57-136325 8/1982 Japan .

*Primary Examiner*—Monroe H. Hayes
*Attorney, Agent, or Firm*—Fitzpatrick, Cella, Harper & Scinto

[57] ABSTRACT

A pattern transfer apparatus for transferring a pattern of a mask onto a wafer. The apparatus includes a wafer chuck for holding the wafer at a position whereat the pattern of the mask is transferred onto the wafer. The temperature of the wafer held by the wafer chuck is controlled to expand/contract the wafer to achieve alignment of the pattern of the mask with a pattern which has already been formed on the wafer. A mechanism for preparatively adjusting the temperature of the wafer before it is moved to the wafer chuck is provided, whereby the time until the temperature of the wafer on the wafer chuck reaches a desired level is reduced and, therefore, throughput of the apparatus is improved. Further, any fluctuation in the temperature of the wafer chuck is prevented so that the reliability of alignment between the pattern of the mask and the pattern formed on the wafer is improved.

2 Claims, 2 Drawing Figures

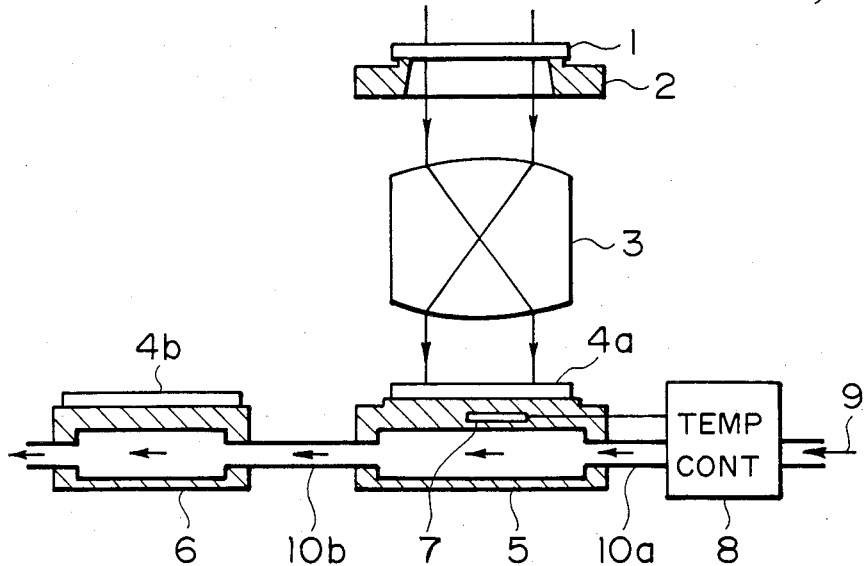
F I G. 1
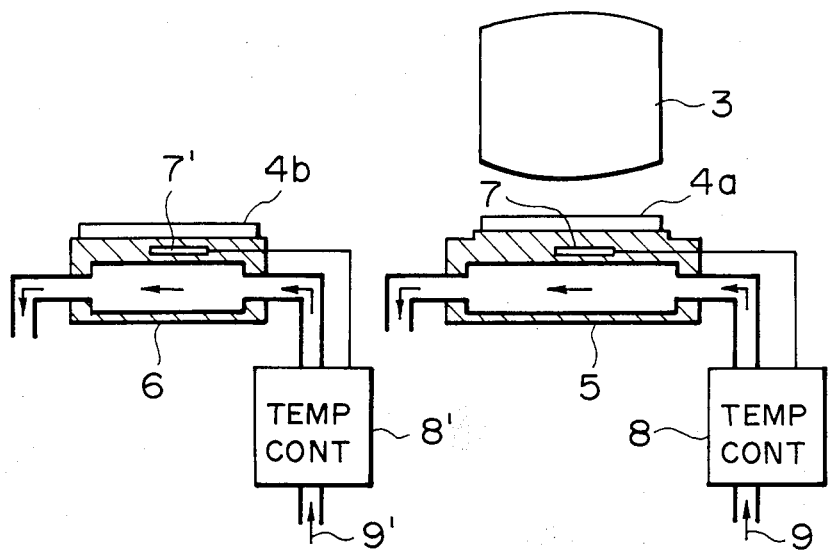
F I G. 2

PATTERN TRANSFER APPARATUS

This application is a continuation of application Ser. No. 689,944 filed Jan. 9, 1985, now abandoned.

BACKGROUND OF THE INVENTION

This invention relates to a pattern transfer apparatus for transferring onto a wafer a pattern for the manufacture of semiconductor circuit devices such as integrated circuits (ICs), large scaled integrated circuits (LSIs), very large scaled integrated circuits (VLSIs), etc. More particularly, the invention relates to a pattern transfer apparatus for transferring a pattern onto a wafer, having a temperature control system for obtaining alignment between a pattern which has already been transferred onto the wafer and a pattern which is to be transferred onto the wafer.

In general, manufacture of semiconductor devices such as ICs, LSIs, VLSIs, etc. involves repeated pattern projection and transfer steps, for a single wafer, for projecting and transferring different circuit patterns formed on different masks. In order to ensure improved capacities of semiconductor devices and higher throughputs, it is a critical factor to obtain a highly accurate alignment between the pattern of a mask which is to be transferred onto the wafer at the current transfer step with the pattern of another mask which has already been transferred onto the same wafer during the preceding transfer step.

Techniques for obtaining accurate alignment have already been proposed, e.g. as disclosed in Japanese Patent Application Laid-Open Nos. 56-112732 published Sept. 5, 1981, b 57-136325 published Aug. 23, 1982, U.S. Pat. Nos. 4,202,623 issued May 13, 1980, and 4,256,829 issued Mar. 17, 1981. According to these techniques, misalignment between a pattern of a mask which is to be transferred onto a wafer in the current transfer step and a pattern of another mask which has been transferred onto the same wafer in the preceding transfer step is corrected by controlling the temperature of the wafer so that it is thermally expanded or contracted. The temperature of the wafer can be controlled by controlling the temperature of a wafer chuck holding the wafer at the pattern transfer position while maintaining the flatness of the wafer.

The inventor of the present invention has found some inconveniences involved in such techniques.

First, a relatively long stand-by time is required until the temperature of the wafer carried on the wafer chuck reaches a desired temperature. In case of a 5-inch wafer, a stand-by time of approx. 6 sec. is necessary. Such stand-by time is useless and decreases the throughput which is one of the most important properties of the semiconductor circuit manufacturing transfer apparatus. This is a particularly serious problem in the case of a recently developed needlepoint-surface chuck. This type of wafer chuck has a chuck surface which is formed with a multiplicity of needlepoints in order to minimize the area of contact with the wafer to remove any effect of foreign particles adhered on the back surface of the wafer. If such type of wafer chuck is used, it requires a stand-by time which is three or more times as long as that required in ordinary wafer chucks. This results in substantial decrease in the throughput.

Second, when the wafers, each having a temperature which is different from that of the temperature-controlled wafer chuck, are sequentially fed to the wafer chuck, there occurs on the wafer chuck a heat loss of an amount corresponding to the number of the wafers. Usually, in the transfer apparatus, fifty or more wafers per one hour are fed to the wafer chuck. In view of this, it is not so easy to compensate for the heat loss caused by the wafers, to maintain a constant temperature of the wafer chuck.

SUMMARY OF THE INVENTION

It is accordingly a primary object of the present invention to provide a pattern transfer apparatus in which alignment between a pattern transferred onto a first member in the preceding transfer step and a pattern of a second member which is to be transferred onto the first member in the current transfer step is achieved by controlling the temperature of the second member in a decreased time so that throughput of the apparatus is improved.

It is another object of the present invention to provide a pattern transfer apparatus for transferring a pattern of a first member onto a second member, in which apparatus the temperature of the second member is controlled to achieve alignment of the second member with the pattern of the first member and in which apparatus any temperature fluctuation in a holding member for the second member is prevented to ensure stable temperature control of the second member.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view showing a pattern transfer apparatus according to one embodiment of the present invention.

FIG. 2 is a schematic and diagrammatic view showing a pattern transfer apparatus according to another embodiment of the present invention.

DESCRIPTION OF THE PREFERRED EMBODIMENTS

FIG. 1 shows an embodiment of the present invention which is applied to a pattern transfer apparatus for the manufacture of semiconductor circuit devices.

The pattern transfer apparatus includes a mask chuck 2 for holding thereon a mask 1, a wafer chuck 5 for holding thereon a wafer 4a by vacuum suction, and a projection optical system 3 for projecting the pattern of the mask 1 onto the wafer 4a. Within the wafer chuck 5, there are provided a cavity through which a thermoregulated fluid such as heated air flows and a temperature-measuring platinum resistor 7 for detecting the temperature of the wafer chuck 5. The pattern transfer apparatus further includes a preparatory temperature control stage 6 for carrying thereon another wafer 4b which will be exposed in the succeeding exposure step. A temperature controller 8 is provided which, on one hand, is connected to an unshown fluid source providing a flow of fluid as designated by an arrow 9 and, on the other hand, is connected via a tube 10a to the cavity of the wafer chuck 5 which in turn is connected via another tube 10b to a cavity formed in the preparatory temperature control stage 6. The temperature measuring platinum resistor 7 is connected to the temperature controller 8 so that the controller 8 controls the temperature of the fluid 9 supplied from the unshown fluid source to the wafer chuck 5. Thus, the fluid 9 having a temperature controlled by the temperature controller 8 is fed into the cavity of the wafer chuck 5 and, after passing through the wafer chuck 5, is fed into the cavity of the preparatory temperature control stage 6.

Since the temperature detecting end of the resistor 7 is disposed within the wafer chuck 5, the target of control is the temperature of the wafer chuck 5. Thus, the temperature of the wafer chuck 5 is maintained at a desired level. Since, however, the thermo-regulated fluid 9 is also fed into the preparatory temperature control stage 6 after passing through the wafer chuck 5, the temperature of the stage 6 also is maintained at a level close to the temperature of the wafer chuck 5.

In operation, the wafer 4a is first subjected to the preparatory temperature control at the stage 6. Thereafter, the wafer 4a is transported to the wafer chuck 5 by an unshown feeding mechanism such as a suction arm, etc. After the alignment with the mask 1 is achieved, the wafer 4a is exposed to a radiation beam of the pattern of the mask 1. Prior to this exposure of the wafer 4a, the wafer 4b which will be exposed in the succeeding exposure step is transported to the preparatory temperature control stage 6 so that the temperature of the wafer 4b is preparatively controlled by the stage 6. After the exposure is completed, the wafer 4a is moved out of the wafer chuck 5. Simultaneously therewith, the wafer 4b is moved onto the wafer chuck 5 whereat the wafer 4b is exposed to the radiation beam of the pattern of the mask 1. Thus, the mask 1 pattern is transferred onto the wafer 4b.

In this manner, a multiplicity of wafers are sequentially exposed at the pattern transfer position on the wafer chuck 5 to the radiation beam of the mask 1 pattern. Since the temperature of each wafer is preparatively controlled by the preparatory temperature control stage 6, the time after one wafer is carried to the wafer chuck 5 and until the temperature of this wafer reaches a desired level, ensuring alignment of a mask pattern which has been transferred onto the present wafer during the preceding pattern transfer step with a mask pattern which is to be transferred onto the same wafer during the current pattern transfer step, is substantially reduced. In addition thereto, the fluctuation in the temperature of the wafer chuck 5 due to the heat loss thereof by the wafers is prevented. It will be understood that the wafer is heated or cooled in accordance with the dimensional relation between the mask pattern which has already been transferred onto the wafer and the mask pattern which is to be transferred onto the same wafer during the current pattern transfer step.

FIG. 2 shows a pattern transfer apparatus according to another embodiment of the present invention with the same reference numerals indicating corresponding elements as of FIG. 1 embodiment.

FIG. 2 embodiment is similar to the FIG. 1 embodiment except for the point that the former is provided with a system for controlling the temperatures of the wafer chuck 5 and the preparatory temperature control stage 6 independently from each other. As shown in FIG. 2, the pattern transfer apparatus includes an additional temperature-measuring platinum resistor 7' disposed within the preparatory temperature control stage 6, and an additional temperature controller 8' which is connected to the temperature detecting resistor 7' and is arranged to control the temperature of a fluid 9', supplied from an unshown fluid source, to adjust the temperature of the preparatory temperature control stage 6.

With this arrangement, the temperatures of the fluids 9 and 9' are controlled by the temperature controllers 8 and 8', respectively and independently from each other. This enables that the temperature of the preparatory temperature control stage 6 is controlled so that it becomes exactly equal to the temperature of the wafer chuck 5 or a temperature difference is intentionally established between the temperatures of the wafer chuck 5 and the stage 6. As a result, the preparative temperature control can be more effectively achieved.

The temperature control medium is not limited to fluid such as an air or liquids. A heat generating resistor, a semiconductor heat exchanging device, etc. will provide the same effects.

As an alternative, the preparatory temperature control stage 6 may be modified to act as another wafer chuck. That is, each of the wafer chuck 5 and the stage 6 controls the temperature of a wafer, carried thereon, fully and independently from the other. After completion of exposure of the wafer carried on the wafer chuck 5, the stage 6 carrying thereon another wafer is moved to the pattern transfer position for the exposure of the wafer carried thereon. In this manner, the wafer chuck 5 and the stage 6 are alternatively positioned at the pattern transfer station. With such arrangement, throughput of the pattern transfer apparatus is further improved.

Usually, the pattern transfer apparatus for the manufacture of semiconductor circuit devices is provided with a wafer positioning stage for setting the orientation and position of each wafer before it is transported to the wafer chuck. Such stage is usually called a prealignment stage and is one of the major parts of the pattern transfer apparatus. An example of the prealignment stage is disclosed in U.S. Pat. No. 3,865,254 issued Feb. 11, 1975. Each wafer is moved onto this prealignment stage and is carried by this stage for a short time period for the purpose of positioning thereof. If such prealignment stage is arranged to execute the temperature control in a manner such as disclosed with reference to FIG. 1 or 2, the preparatory temperature control of the wafer can be achieved while effecting the prealignment of the wafer. If such system is employed, it is unnessary to add a preparatory temperature control stage to a traditional pattern transfer apparatus. Further, no additional time is required for the preparatory temperature control. As a result, the preparatory temperature control of the wafer can be achieved very efficiently.

In accordance with the present invention, as has hitherto been described, a desired temperature of the wafer carried on the wafer chuck can be established within a very short time. This is effective to substantially improve the throughput of the pattern transfer apparatus. Further, according to the present invention, the temperature of the wafer chuck can be stabilized so that stable temperature control for the wafer is assured.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for sequentially transferring images of a pattern onto a plurality of objects, said appartus comprising:

transfer means for transferring an image of the pattern onto a first object placed at a pattern transfer station;

a supporting chuck for supporting the first object at the pattern transfer station, said supporting chuck having a cavity formed therein;

a supporting stage coupled to said supporting chuck and being operable, when the image of the pattern is being transferred by said transfer means onto the first object supported by said supporting chuck at the pattern transfer station, to support at a non-transfer station a second object onto which the image of the pattern is subsequently to be transferred by said transfer means, said supporting stage having a cavity formed therein;

coupling means having a tube, for coupling said supporting chuck and said supporting stage so that said cavity of said supporting chuck and said cavity of said supporting stage are in fluid communication with each other;

fluid supplying means for supplying a temperature controlling fluid into said cavity of said supporting chuck so that the fluid passes from said cavity of said supporting chuck to said cavity of said supporting stage by way of said tube of said coupling means;

a temperature sensor for sensing the temperature of said supporting chuck being controlled by the temperature controlling fluid; and a temperature controller for controlling the temperature of the temperature controlling fluid in accordance with the sensing by said temperature sensor, whereby the temperature of the first object supported by said supporting chuck is controlled by the temperature controlling fluid supplied into said cavity of said supporting chuck and wherein the temperature of the second object supported by said supporting stage is roughly controlled by the temperature controlling fluid having been used for the control of the temperature of the first object.

2. An apparatus according to claim 1, wherein said supporting stage comprises a prealignment stage operable to preparatorily adjust the position and the orientation of the second subject.

* * * * *

UNITED STATES PATENT AND TRADEMARK OFFICE
CERTIFICATE OF CORRECTION

PATENT NO. : 4,720,732
DATED : January 19, 1988
INVENTOR(S) : SHINJI TSUTSUI

It is certified that error appears in the above-identified patent and that said Letters Patent is hereby corrected as shown below:

COLUMN 1

Line 34, "b" should be deleted.

COLUMN 4

Line 12, "an" should be deleted.
Line 44, "unnessary" should read --unnecessary--.
Line 67, "appartus" should read --apparatus--.

COLUMN 6

Line 22, "subject" should read --object--.

Signed and Sealed this

Seventh Day of February, 1989

Attest:

DONALD J. QUIGG

Attesting Officer    Commissioner of Patents and Trademarks